United States Patent
Richter et al.

(10) Patent No.: US 8,258,594 B2
(45) Date of Patent: Sep. 4, 2012

(54) AVALANCHE PHOTODIODE

(75) Inventors: Rainer Richter, Munich (DE); Ladislav Andricek, Poecking (DE); Gerhard Lutz, Munich (DE)

(73) Assignee: PNSensor GmbH, Munich (DE)

( * ) Notice: Subject to any disclaimer, the term of this patent is extended or adjusted under 35 U.S.C. 154(b) by 319 days.

(21) Appl. No.: 12/672,102

(22) PCT Filed: Jun. 18, 2008

(86) PCT No.: PCT/EP2008/004903
§ 371 (c)(1),
(2), (4) Date: Feb. 22, 2010

(87) PCT Pub. No.: WO2009/018872
PCT Pub. Date: Feb. 12, 2009

(65) Prior Publication Data
US 2011/0095388 A1    Apr. 28, 2011

(30) Foreign Application Priority Data
Aug. 6, 2007 (DE) .......... 10 2007 037 020

(51) Int. Cl.
H01L 31/0232 (2006.01)
(52) U.S. Cl. .................... 257/432
(58) Field of Classification Search .......... 257/106, 257/186, 432, 481–482, 493, 438, E21.354, 257/E21.355, E21.356, E21.357, 90, 589, 257/603–606, E31.063, E29.18, E29.334–E29.335; 438/91
See application file for complete search history.

(56) References Cited

U.S. PATENT DOCUMENTS
3,703,669 A    11/1972    London
(Continued)

FOREIGN PATENT DOCUMENTS
EP    1840967 A1    10/2007
(Continued)

OTHER PUBLICATIONS
International Search Report for PCT/EP2008/004903, Publication date: Feb. 12, 2009 and International Application filing date: Jun. 18, 2008.
(Continued)

Primary Examiner — Dao H Nguyen
Assistant Examiner — Tram H Nguyen
(74) Attorney, Agent, or Firm — Caesar, Rivise, Bernstein, Cohen & Pokotilow, Ltd.

(57) ABSTRACT

The invention relates to an avalanche photodiode (1) for detecting radiation, including a semiconductor substrate (11), an upper diode layer (15), an oppositely doped, laterally delimited lower diode layer (16), an avalanche region situated between the upper diode layer (15) and the lower diode layer (16), wherein the radiation to be detected triggers an avalanche breakdown in the avalanche region, and also including a contact-making layer (12) at the underside (10) of the semiconductor substrate (11), a laterally delimited quenching resistance layer (18) arranged in the semiconductor substrate (11) between the lower diode layer (16) and the contact-making layer (12), wherein the quenching resistance layer (18) quenches the radiation-generated avalanche breakdown in the avalanche region, and also including a depletion electrode (15) arranged laterally alongside the laterally delimited lower diode layer (16), such that the depletion electrode (15) depletes the semiconductor substrate (11) laterally alongside the laterally delimited lower diode layer (16), while the quenching resistance layer (18) is screened from the depletion electrode (15) by the lower diode layer (16) and is therefore not depleted.

27 Claims, 10 Drawing Sheets

U.S. PATENT DOCUMENTS

| | | | |
|---|---|---|---|
| 5,500,376 A | 3/1996 | Ishaque et al. | |
| 5,861,655 A | 1/1999 | Kozuka et al. | |
| 6,114,737 A * | 9/2000 | Tonai | 257/434 |
| 6,222,209 B1 | 4/2001 | Antich et al. | |
| 2004/0245592 A1* | 12/2004 | Harmon et al. | 257/438 |
| 2006/0249747 A1 | 11/2006 | Shushakov et al. | |
| 2006/0289957 A1* | 12/2006 | Morse et al. | 257/438 |
| 2008/0191123 A1* | 8/2008 | Lutz et al. | 250/208.1 |

FOREIGN PATENT DOCUMENTS

| | | |
|---|---|---|
| EP | 1755171 B1 | 12/2009 |
| JP | 54146681 A | 11/1979 |
| JP | 200964398 A | 3/2009 |

OTHER PUBLICATIONS

Goesele et al., "Semiconuctor Wafer Bonding", Annu. Rev. Mater. Sci., vol. 28, pp. 215-241 (1998).

Klumpp et al., "Vertical System Integration by Using Inter-Chip Vias and Solid-Liquid Interdiffusion Bonding", Japanese Journal of Applied Physics, vol. 43, No. 7A, pp. L[1]-[2] (2004).

Lutz et al., "Semiconductor Radiation Detectors", 2. edition, published by Springer 2001, pp. 239-242 (2001).

Sadygov et al., "Three advanced designs of micro-pixel avalanche photodiodes: Their present status, maximum possibilities and limitations", Nuclear Instruments and Methods in Physics Research A, vol. 567, pp. 70-73 (2006).

* cited by examiner

AVALANCHE PHOTODIODE

BACKGROUND OF THE INVENTION

The invention relates to an avalanche photodiode for detecting radiation.

Sadygov Z.: "Three advanced designs of micro-pixel avalanche photodiodes: Their present status, maximum possibilities and limitations", Nuclear Instruments and Methods in Physics Research A 567 (2006) 70-73 discloses this type of avalanche photodiode which can be used for the purpose of detecting radiation. Located in this case in a semiconductor substrate is an avalanche region which is formed by means of a pn-transition between a cathode layer and an anode layer and in which the radiation to be detected triggers an avalanche breakdown. Furthermore, a quenching resistor is provided in this case which is connected in series to the avalanche region and has the task of terminating a radiation-generated avalanche breakdown, in that the voltage drop across the quenching resistor lowers the current until the charge carrier multiplication dies off in the avalanche region.

In one variation of this known avalanche photodiode, the quench resistor is situated partially on the radiation entry window and must still be at least partially contacted with thin metallic layers. In this case, the quenching resistor thus forms an obstacle for the radiation which is to be detected, whereby the detection efficiency deteriorates drastically particularly for ultraviolet (UV) and blue light.

In another variation, it is provided in the above-mentioned publication by Sadygov et al. that the quenching resistor is integrated together with a coupling capacitor into the semiconductor substrate (bulk), wherein the avalanche region is located deeply buried in the semiconductor substrate on an epitaxial layer boundary surface.

On the one hand, this is associated, as stated in the said publication, with technological difficulties, as deep ion implantation and epitaxial growth are required on highly pure silicon wafers.

On the other hand, a common quenching resistor is provided in each case for many avalanche photodiodes, so that upon activation of a diode large neighboring regions become insensitive.

A further problem relating to the known avalanche photodiodes is based upon the fact that radiation detectors are operated in general in an environment exposed to radiation. Therefore, comprehensive preliminary tests are required especially in the case of space-related applications, in order to ensure adequate long-term stability of the avalanche photodiodes. Although silicon as a semiconductor material for avalanche photodiodes has the significant advantage of a passivating oxide which has excellent dielectric properties and can be produced with relatively small defects and warping on the silicon-silicon dioxide boundary surface, this boundary surface still constitutes the most sensitive part with respect to ionizing radiation. Both the additionally generated boundary surface charges and the boundary surface generation current (leakage current) can exceed the initial values by orders of magnitude prior to irradiation. Primarily, the isolation structures of the conventional radiation detectors frequently fail for this reason. Therefore, detectors with a higher level of beam resistance are desirable.

Furthermore, with respect to the prior art reference is to be made to EP 1 840 967 A1 and JP 09-64398 AA, EP 1 755 171 A1, US 2006/0249747 A1 and U.S. Pat. No. 6,222,209 B1.

Therefore, the object of the invention is to improve the above-described conventional avalanche photodiode accordingly.

Preferably, the avalanche photodiode in accordance with the invention should be able to be arranged in matrix form in a radiation detector, in order to detect individual optical photons.

Furthermore, the avalanche photodiode in accordance with the invention should be producible in the simplest manner possible.

It is also desirable that the avalanche photodiode in accordance with the invention is as resistant as possible to ionizing beams.

Furthermore, the avalanche photodiode in accordance with the invention should have a high quantum efficiency and a high degree of sensitivity in the ultraviolet and blue spectral range.

The aforementioned objects are achieved by means of an avalanche photodiode in accordance with the invention.

SUMMARY OF THE INVENTION

The avalanche photodiode in accordance with the invention is constructed in part in a conventional manner and comprises a semiconductor substrate having a top side and a bottom side, wherein the semiconductor substrate is doped according to a first doping type (e.g. n-doping). Preferably, the semiconductor substrate consists of silicon yet in terms of the semiconductor material the invention is not limited to silicon but can fundamentally also be produced with other semiconductor materials.

Furthermore, the avalanche photodiode in accordance with the invention typically comprises two oppositely doped diode layers disposed one above the other (cathode and anode) which are disposed in the semiconductor substrate close to the surface on the top side and include an avalanche region, in which the radiation to be detected triggers an avalanche breakdown in the event of a corresponding bias voltage.

Preferably, the cathode layer is located in this case at the top and the anode layer is located at the bottom but the invention is not limited to this arrangement. On the contrary, it is fundamentally also possible that the anode layer is disposed at the top, whereas the cathode layer is located therebelow.

Furthermore, the avalanche photodiode in accordance with the invention comprises a contacting layer which is disposed on the bottom side of the semiconductor substrate and is doped according to the first doping type (e.g. n-doping). For example, the contacting layer renders it possible to apply an electrical bias voltage to the avalanche photodiodes, in order that the avalanche photodiode is operated in the so-called Geiger mode, so that electrons and also holes contribute to the carrier multiplication and thereby cause an avalanche breakdown, in which the current is limited in principle only by serial resistors.

Furthermore, the avalanche photodiode in accordance with the invention provides a quenching resistor which is connected electrically in series with the avalanche region and in the event of an avalanche breakdown in the avalanche region is intended to ensure that the avalanche breakdown is quenched by means of a current limitation by the quenching resistor. However, in contrast to the prior art, the quenching resistor in the case of the invention is formed as a quenching resistance layer and is integrated into the semiconductor substrate, wherein the quenching resistance layer is located between the avalanche region and the contacting layer, i.e. below the lower diode layer, wherein this is preferably the anode layer. This is advantageous because the lower diode layer shields the quenching resistance layer in this manner from the depleting effect of the upper diode layer, as described in detail hereinafter.

Furthermore, the avalanche photodiode in accordance with the invention provides a depletion electrode which is disposed at least partially in a lateral manner next to the laterally restricted lower diode layer and is doped according to the second doping type. The depletion electrode has the task of depleting the semiconductor substrate laterally next to the laterally restricted lower diode layer, in order to electrically isolate the avalanche photodiode in the lateral direction. This is particularly advantageous if numerous avalanche photodiodes in accordance with the invention are disposed next to each other in an avalanche radiation detector, as the depletion electrode then ensures that the immediately adjacent avalanche photodiodes are electrically isolated from each other.

In this case, the lower diode layer (preferably the anode layer) which is located above the quenching resistance layer shields the quenching resistance layer electrically from the depletion electrode, so that the quenching resistance layer is not depleted or is only partially depleted.

The depletion of the semiconductor substrate in the region laterally next to the laterally restricted lower diode layer is effected preferably completely over the entire thickness of the semiconductor substrate, i.e. the semiconductor substrate is completely depleted laterally next to the lower diode layer from the top side to the bottom side.

However, within the scope of the invention it is also possible that the depleting effect of the depletion electrode in the semiconductor substrate extends only to a specific depth, so that depletion islands are only formed in the semiconductor substrate laterally next to the laterally restricted lower diode layer, which depletion islands do not extend as far as the bottom side of the semiconductor substrate in the vertical direction.

In one variation of the invention, the depletion electrode is formed by means of the upper diode layer which for this purpose protrudes with a side portion laterally beyond the laterally restricted lower diode layer and together with the protruding side portion forms the depletion electrode. In this case, no separate electrical control of the depletion electrode is required, as the upper diode layer is already electrically contacted.

In contrast, in another variation of the invention the depletion electrode is separated electrically and spatially from the upper diode layer and is formed as a separate electrode. In an advantageous manner, this renders it possible to control the depletion electrode with an independent electrical potential, in order to achieve the desired depleting effect in the semiconductor substrate. This can be necessary e.g. if the spaced intervals between the adjacent avalanche photodiodes are very small and the cathode voltage is no longer sufficient for completely depleting the semiconductor substrate in the intermediate space between the adjacent avalanche photodiodes.

Furthermore, the quenching resistance layer in accordance with the invention forms a coupling capacitance, as is already known from conventional avalanche photodiodes.

What is advantageous about the integration of the quenching resistor as a quenching resistance layer into the semiconductor substrate is the fact that the upper diode layer can be completely unstructured on the top side of the semiconductor substrate, whereby the detection efficiency is drastically improved especially in the ultraviolet and blue spectral range.

This also gives rise to the possibility that an optical filter layer is applied to the top side of the avalanche photodiode, which filter layer can be likewise laterally unstructured over the avalanche region.

It has already been mentioned above that the quenching resistance layer has the task of terminating a radiation-generated avalanche breakdown. The quenching resistor must therefore have a resistance of such a magnitude that in the event of an avalanche breakdown the current is less than circa 20 µA. In the case of a current of this magnitude it is highly probable that the charge carrier density representing this current will fluctuate at least for a short time to the value zero in the avalanche region, which causes the charge carrier avalanche to die off as desired. Therefore, in the case of the avalanche photodiode in accordance with the invention the quenching resistance layer preferably has such a large resistance value that in the event of an avalanche breakdown the current in the avalanche region dies off at least at times and thus terminates the avalanche breakdown. For this purpose, the quenching resistance layer should have a resistance value of at least 0.1 MΩ, 0.5 MΩ, 1 MΩ or at least 2 MΩ. However, in terms of the resistance value of the quenching resistance layer the invention is not limited to the aforementioned limit values but rather can also be produced with other resistance values in dependence upon further boundary conditions.

It should also be mentioned that the quenching resistance layer preferably has a thickness in the range of 10 µm to 100 µm. Preferably, the thickness of the quenching resistance layer is thus greater than 10 µm, 20 µm or 50 µm. Furthermore, the thickness of the quenching resistance layer is preferably less than 1000 µm, 500 µm, 200 µm, 100 µm or 50 µm. However, in terms of the thickness of the quenching resistance layer the invention is not limited to the aforementioned numerical values.

It should also be mentioned that the lower diode layer (preferably the anode layer) generally has a thickness which is greater than the thickness of the avalanche region. Preferably, the thickness of the lower diode layer is greater than 1 µm, 2 µm, 5 µm or 10 µm. However, in terms of the thickness of the lower diode layer the invention is not limited to the aforementioned numerical values.

It should also be mentioned that the upper diode layer preferably has a thickness which amounts to several 10 nm to a few 100 nm. Preferably, the thickness of the upper diode layer is thus greater than 5 nm, 10 nm, 20 nm or 50 nm. Furthermore, the thickness of the upper diode layer is preferably smaller than 1000 nm, 500 nm, 400 nm, 300 nm, 200 nm or 100 nm. However, in terms of the thickness of the upper diode layer the invention is not limited to the aforementioned numerical values.

With respect to the quenching resistance layer, it should also be mentioned that the doping concentration thereof is preferably in the range of $0.5 \cdot 10^{12}$ cm$^{-3}$ to $10^{14}$ cm$^{-3}$. In particular, the doping concentration in the quenching resistance layer is greater than $0.5 \cdot 10^{12}$ cm$^{-3}$, $0.7 \cdot 10^{12}$ cm$^{-3}$ or $10^{12}$ cm$^{-3}$. However, in terms of the doping concentration in the quenching resistance layer the invention is not limited to the aforementioned numerical ranges.

It should also be mentioned that the first doping type is preferably an n-doping, whereas the second doping type is preferably a p-doping. However, the invention can also be accomplished with an inverse doping, wherein the first doping type is a p-doping, whereas the second doping type is an n-doping.

It should also be mentioned that the upper diode layer and the contacting layer are preferably relatively strongly doped, whereas the semiconductor substrate and thus the quenching resistance layer are preferably relatively weakly doped.

It should also be mentioned that the semiconductor substrate is preferably monocrystalline.

Further constructional details of avalanche photodiodes are disclosed e.g. in Lutz, G.: "Semiconductor Radiation Detectors", 2$^{nd}$ edition, Springer Verlag 2001, page 239-242, so that the content of this reference book can be attributed entirely to the present description in terms of the structure and the mode of function of the avalanche photodiode in accordance with the invention.

It should also be mentioned that in the case of the avalanche photodiode in accordance with the invention the radiation entry window for absorbing the radiation to be detected is disposed preferably on the top side, i.e. on the same side as the avalanche region.

The vertical extension of the semiconductor substrate and thus also the thickness of the avalanche photodiode in accordance with the invention is determined substantially by the thickness of the quenching resistance layer. Normally, typical semiconductor wafers are, however, several 100 μm thick, in order to ensure a level of mechanical stability required for processing. The generally n-doped contacting layer on the bottom side of the avalanche photodiode can naturally be extended in virtually any manner in the vertical direction.

A further advantage is achieved if the quenching resistance layer has a lateral and/or vertical doping profile. For example, a doping gradient can be provided, in which the doping concentration in the quenching resistance layer increases upwards. Particularly in the case of small-surface avalanche photodiodes or in the case of relatively thick resistance layers, extensive lateral depletion can occur primarily in the upper region of the resistance layer as a result of the effect of the depletion electrode (space charge zone, depletion zone). This can even lead to pinch off of the quenching resistance layer. By raising the doping concentration in the upper region of the semiconductor substrate, the lateral extension of the space charge zone is advantageously suppressed and pinch off is avoided. The change in the doping concentration can be effected e.g. locally by means of an n-type ion implantation layer introduced below the anodes with high energy. However, if the quenching resistance layer is grown epitaxially it is also possible during the epitaxy procedure to adjust a vertical, laterally unstructured doping profile, in particular within the weakly doped n-layer in a specific manner.

In terms of production, it is possible to grow the weakly n-doped quenching resistance layer epitaxially on a highly n-doped wafer. In one variation of the invention, the contacting layer is thus formed by a highly doped wafer, onto which the quenching resistance layer is applied.

An alternative option is to employ the method known as wafer bonding which is described e.g. in Tong, Q. Y.; Gösele, U.: "Semiconductor Wafer Bonding", John Wiley and Sons, New York, 1999, so that the content of this publication can be attributed entirely to the present description in terms of the technology of wafer bonding. In this case, two silicon wafers are connected monolithically to each other after a suitable surface pre-treatment. The lower wafer serves in this case as a stable mechanical carrier and is highly n-doped, so that within the scope of the invention it fulfils the function of the contacting layer. In contrast, the upper wafer is weakly doped and after wafer bonding is grinded approximately to the target thickness of the quenching resistance layer and is then lapped and polished, in order to produce the required level of surface quality. During the further processing, the sandwich structure thus obtained can be treated in the same manner as a standard wafer. Frequently, the wafers in this case are oxidized prior to bonding, whereby an SOI-structure (SOI: Silicon on Insulator) is produced, as described in the aforementioned reference book by Tong/Gösele. The advantage of wafer bonding over the epitaxy method resides in the fact that a greater degree of flexibility is acquired in selecting the doping for the quenching resistance layer. Although nowadays modern epitaxy installations can already grow very high-ohmic layers the FZ-crystal growing method (FZ: Float Zone) which is available for wafer production is superior for producing very highly pure silicon.

In this variation of the invention, the avalanche photodiode thus comprises a carrier layer which is disposed on the bottom side of the contacting layer and mechanically supports the avalanche photodiode. The carrier layer can consist e.g. of silicon, silicon dioxide, glass, in particular quartz glass, sapphire, a ceramic or a highly doped semiconductor material, but other materials can essentially also be used for the carrier layer.

Also disposed between the contacting layer and the carrier layer is preferably an isolation layer which can consist e.g. of silicon dioxide. This is the case in particular with the aforementioned SOI-structure, in which two wafers are connected to each other, wherein at least one wafer has been oxidized prior to bonding.

In order to produce detector matrices having matrix elements larger than 100×100 μm, with which high detection efficiencies can be achieved, very high-ohmic resistance layers are required by reason of the large cross-section of the vertical quenching resistors. For such large matrix elements it is possible to use a high-ohmic FZ-wafer as a basis. By reason of its thickness, the isolation region can only be partially depleted, so that the quenching resistors are not separated in the lower region. Upon activation of a matrix element (i.e. one of the avalanche photodiodes in accordance with the invention), the anodes of the neighboring elements are likewise slightly discharged. If these neighbors trigger within the recharging period, their signal reduces, which causes the individual photon spectra to broaden. For applications with small signal rates, this disadvantage does not carry any weight, so that in this case it is possible to omit the complete separation of the adjacent avalanche photodiodes in favor of a cost-effective process.

In accordance with a further embodiment of the invention, the effect of the depletion electrode can be enhanced by the provision of a doped region in the semiconductor substrate. The doped region is provided laterally next to the quenching resistance layer and is doped according to the second doping type. In an advantageous manner, this provides a further possibility (in addition to the separated depletion electrode) of depleting the isolating, depleted part of the semiconductor substrate with smaller voltages. The built-in potential produced between the p-doped layer and the adjacent n-doped layer(s) leads to an intrinsic space charge zone which has a significant extension specifically in the weakly doped semiconductor substrate. Owing to the root-like dependency of the extension of the space charge zone upon the voltage this type of p-layer is particularly effective if it is located on the bottom side of the semiconductor substrate.

However, the invention is not limited only to the aforementioned avalanche diode in accordance with the invention as an individual component, it also includes an avalanche radiation detector having several avalanche photodiodes in accordance with the invention which are disposed adjacent one another. The avalanche photodiodes are preferably disposed in the form of a matrix in straight rows and columns or with a regular hexagonal geometry or with a modified geometry. The regular hexagonal geometry has the advantage that the avalanche photodiodes of a particularly high density and small dead area can be disposed.

In this case, the individual avalanche photodiodes are preferably connected in parallel with a common amplifier.

Although the local resolution of the avalanche radiation detector is foregone as a result of this, this type of arrangement offers the advantage that upon activation of one of the avalanche photodiodes the other avalanche photodiodes remain sensitive and it is therefore possible to count photons if they arrive in various elements. The strength of the signal measured by the amplifier can then be used for the purpose of deducing the number of activated diodes and thus the radiation strength.

In one variation of the avalanche radiation detector in accordance with the invention, the upper diode layer (preferably the cathode layer) of the individual avalanche photodiodes extends in the lateral direction over several adjacent avalanche photodiodes, wherein the upper diode layer detects preferably all of the avalanche photodiodes. In contrast, the lower diode layer (preferably the anode layer) of the individual avalanche photodiodes is interrupted in this variation in each case between the adjacent avalanche photodiodes and has an intermediate space. The upper diode layer is thus not shielded from the lower diode layer in the intermediate spaces between the adjacent avalanche photodiodes, so that the upper diode layer acts in the intermediate spaces as a depletion electrode and depletes the semiconductor substrate in the intermediate spaces, whereby the adjacent avalanche photodiodes are electrically isolated from each other.

However, it is alternatively possible for the upper diode layer also to be interrupted in each case between the adjacent avalanche photodiodes, wherein a separate depletion electrode is then disposed in the intermediate spaces, in order to deplete the semiconductor substrate in the intermediate spaces. In the case of a matrix-like arrangement of the individual avalanche photodiodes, the depletion electrodes can then also be disposed in a grid-like manner and can be controlled independently of the avalanche photodiodes.

In one variation of the avalanche radiation detector in accordance with the invention, the individual avalanche photodiodes are connected to the amplifier via a common connection line, wherein the connection line contacts the common upper diode layer which all avalanche photodiodes collectively have.

However, it is alternatively possible for the individual avalanche photodiodes to be connected to the amplifier via several parallel connection lines, wherein the individual connection lines each contact the upper diode layer in the area surrounding the respective avalanche photodiodes. This offers the advantage that only relatively small voltage drops occur along the upper diode layer, as the signal is dissipated directly via the nearest connection lines.

In one development of the invention, it is also provided that the adjacent avalanche photodiodes are optically isolated from each other, in order to prevent any optical crosstalk between the adjacent avalanche photodiodes. This optical isolation consists preferably of isolation trenches which are etched between the adjacent avalanche photodiodes and absorb or reflect photons generated in the avalanche photodiodes. In this case, the isolation trenches can comprise trench walls which are doped according to the second doping type and/or are at the potential of the upper diodes.

BRIEF DESCRIPTION OF SEVERAL VIEWS OF THE DRAWINGS

Other advantageous developments of the invention are explained in greater detail hereinafter together with the description of the preferred exemplified embodiments of the invention with reference to the Figures, in which.

DETAILED DESCRIPTION OF PREFERRED EMBODIMENTS

Figure 1:
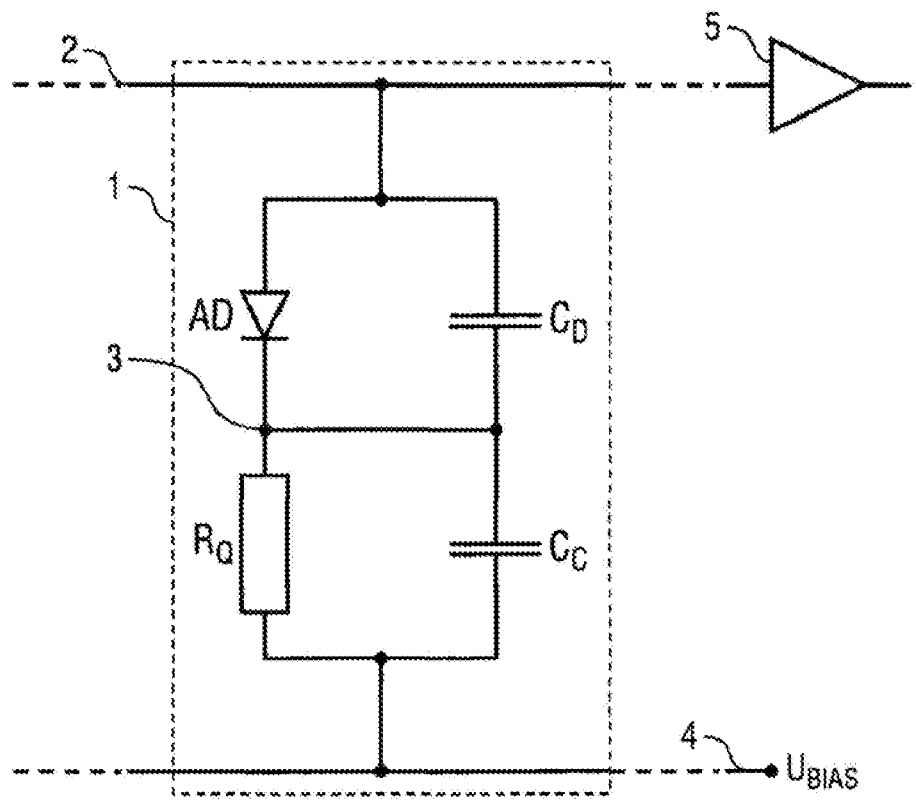
FIG. 1 shows an equivalent circuit diagram of an avalanche photodiode in accordance with the invention, including a quenching resistor and coupling capacitance.

FIG. 1 illustrates an equivalent circuit diagram of an avalanche photodiode 1 in accordance with the invention which is disposed in the form of a matrix in an avalanche radiation detector having numerous further avalanche photodiodes 1 and is used for the purpose of detecting radiation.

The avalanche photodiode 1 consists, as a real component, of a parallel circuit of an ideal avalanche diode AD with an ideal diode capacitance $C_D$ which are connected together between a read-out node 2 (virtual earth) and a reload node 3.

Furthermore, the avalanche photodiode 1 comprises, as a real component, a parallel circuit consisting of an ideal quenching resistor $R_Q$ and a coupling capacitance $C_C$, wherein this parallel circuit is connected between the reload node 3 and a bias voltage node 4.

The read-out node 2 is connected to an amplifier 5 which measures the output signals of all avalanche photodiodes 1 of the matrix-shaped detector structure.

Figure 2:
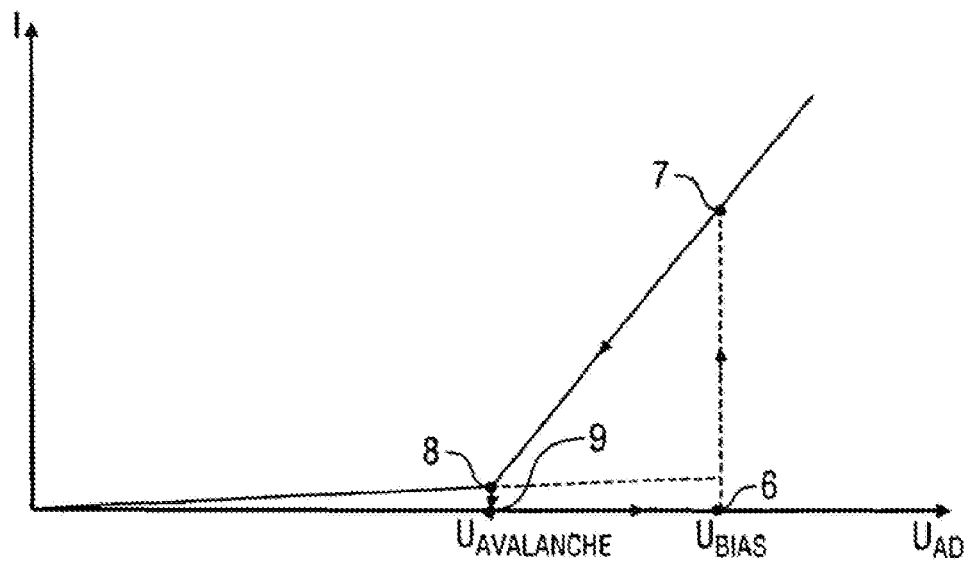
FIG. 2 shows the current-voltage characteristic curve of the avalanche photodiode of FIG. 1.

In contrast, the bias voltage node 4 is influenced during operation by a bias voltage $U_{BIAS}$, wherein the bias voltage $U_{BIAS}$ is greater than the breakdown voltage $U_{AVALANCHE}$ of the avalanche photodiode 1, so that a radiation-generated production of a signal charge carrier in the avalanche diode immediately generates an avalanche breakdown. Then, in the characteristic curve graph of FIG. 2 the avalanche photodiode passes from an operating point 6 along the dotted line to an operating point 7. Then, at the operating point 7 the electrical voltage which is falling across the quenching resistor $R_Q$ increasingly limits the electrical current, so that the avalanche photodiode 1 passes along the characteristic curve from the operating point 7 to an operating point 8. At the operating point 8, the electrical current through the avalanche photodiode 1 is then still only about 20 μA, as a result of which the electrical current fluctuates to zero at least for a short period of time, which leads to the cessation of the avalanche, so that the avalanche photodiode 1 passes from the operating point 8 to the operating point 9 and then to the original operating point 6.

The structure of the avalanche photodiode 1 in accordance with the invention will now be described hereinafter with reference to FIG. 3, wherein in this case two avalanche photodiodes are illustrated next to each other. A plurality of avalanche photodiodes forms the avalanche radiation detector in accordance with the invention.

On a bottom side 10 of a semiconductor substrate 11, the avalanche photodiode 1 comprises a laterally continuous and highly n-doped contacting layer 12.

Located on an opposite-lying top side 13 is an optical filter layer 14, which is known per se from the prior art e.g. for the purpose of reflection-reduction and does not require further description.

Located underneath the optical filter layer 14 is a highly p-doped cathode layer 15 having a layer thickness $d_K$ of 10 nm to a few 100 nm. The cathode layer 15 is laterally unstructured and is continuous over the entire width of the detector structure, as will be explained in detail. In the avalanche radiation detector, the cathode layer 15 is connected to the amplifier 5 via a contact 24.

Located below the cathode layer 15 is an n-doped anode layer 16, wherein the anode layer 16 is laterally restricted and leaves an intermediate space 17 free between the adjacent avalanche photodiodes 1. The intermediate space 17 ensures that the cathode layer 15 completely depletes the semiconductor substrate 11 in the intermediate space 17 between the two adjacent avalanche photodiodes 1, so that the adjacent avalanche photodiodes 1 are electrically isolated from one another by virtue of the depletion in the intermediate space 17.

Located between the cathode layer 15 and the anode layer 16 located therebelow is an avalanche region, in which the incident radiation generates an avalanche breakdown.

Also located below the anode layer 16 is a quenching resistance layer 18 which is weakly n-doped. In this case, the anode layer 16 shields the laterally restricted quenching resistance layer 18 from the depleting effect of the cathode layer 15 located thereabove, so that the quenching resistance layer 18 does not deplete.

In the case of this exemplified embodiment, it is thus important that the cathode layer 15 protrudes in the lateral direction beyond the anode layer 16 into the intermediate space 17, so that the cathode layer 15 forms in the intermediate space 17 a depletion electrode which depletes the semiconductor substrate 11 in the intermediate space 17.

In this case, the anode layer 16 has a thickness $d_A$ in the micrometer range, whereas the quenching resistance layer 18 has a thickness $d_R$ in the range of 10 μm to about 100 μm.

Figure 3:
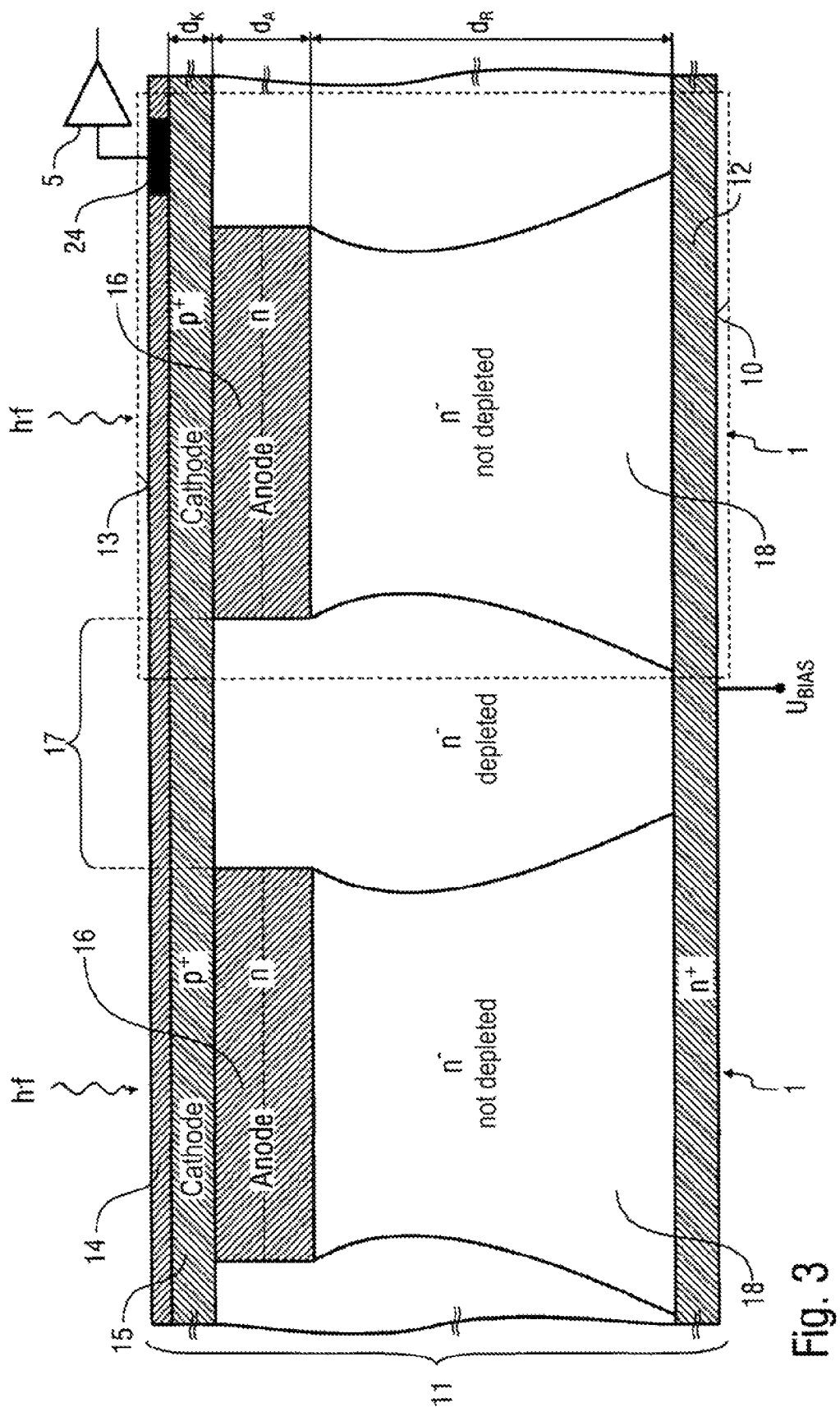
FIG. 3 shows a cross-sectional view of a part of an avalanche radiation detector in accordance with the invention, wherein the cross-sectional view illustrates two avalanche photodiodes in accordance with the invention.
Figure 4:
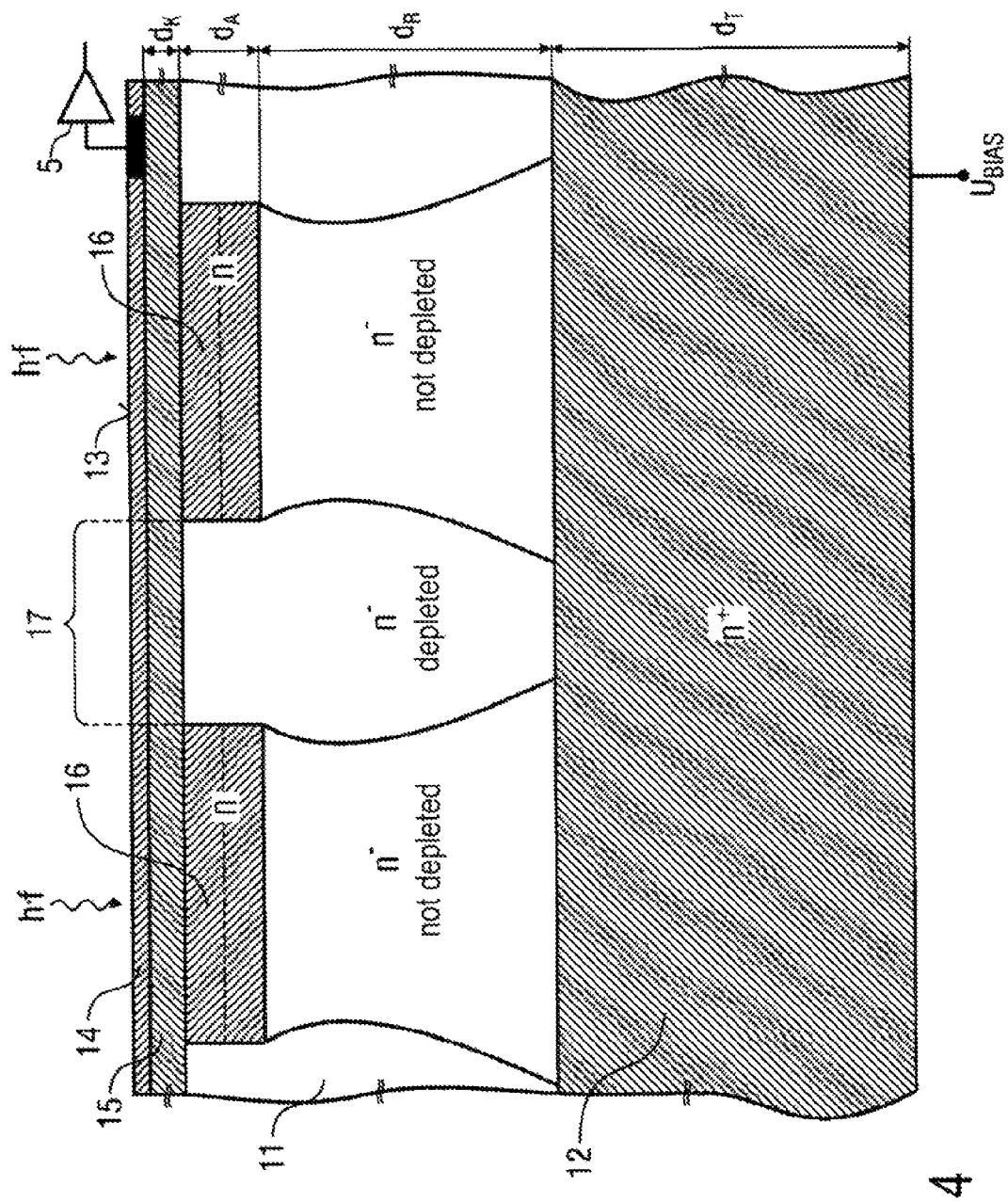
FIG. 4 shows a modification of the exemplified embodiment of FIG. 3 with a carrier wafer on the bottom side.

The exemplified embodiment as shown in FIG. 4 corresponds extensively with the above-described exemplified embodiment illustrated in FIG. 3, so that in order to avoid repetition reference is made to the above description, wherein the same reference numerals are used for corresponding details.

One characteristic of this exemplified embodiment is that the lower contacting layer 12 is formed by means of a highly n-doped carrier wafer.

In the production of this exemplified embodiment, the quenching resistance layer 18 is grown epitaxially onto the contacting layer 12.

The exemplified embodiment as shown in FIG. 5 again corresponds extensively with the above-described exemplified embodiments, so that in order to avoid repetition reference is made to the above description, wherein the same reference numerals are used for corresponding details.

One characteristic of this exemplified embodiment is that an isolation layer 19 is also disposed underneath the contacting layer 12.

In this case, a carrier layer 20 is disposed in turn underneath the isolation layer 19 and can consist e.g. of silicon or glass.

Therefore, this constitutes the SOI-structure already mentioned in the introduction which is produced by wafer bonding.

Figure 6:
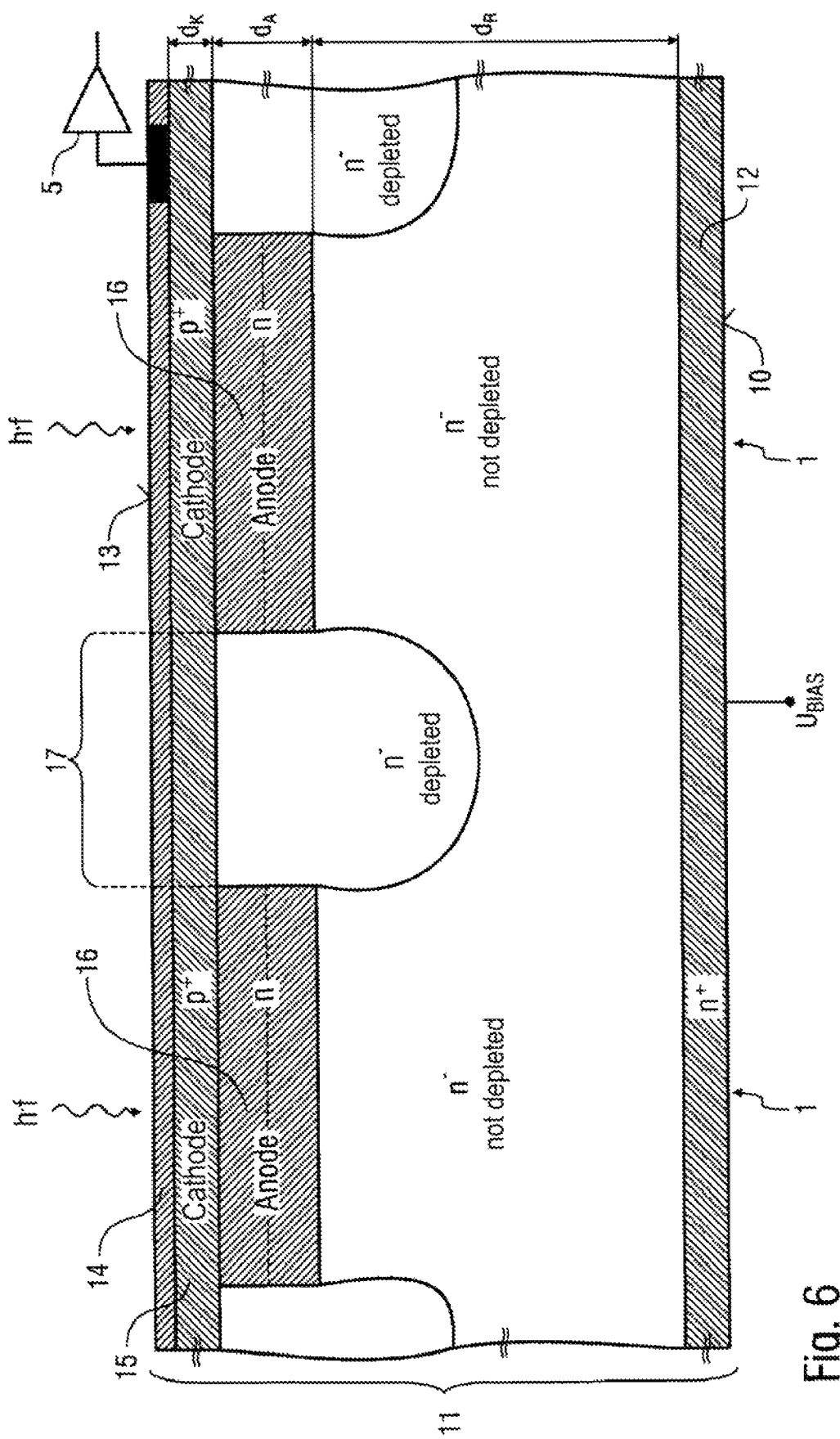
FIG. 6 shows a modification of the exemplified embodiment of FIG. 3, wherein the semiconductor substrate in the intermediate spaces between the adjacent avalanche photodiodes is not completely depleted as far as the bottom side.

The exemplified embodiment as shown in FIG. 6 again corresponds extensively with the above-described exemplified embodiment illustrated in FIG. 3, so that in order to avoid repetition reference is made to the above description, wherein the same reference numerals are used for corresponding details.

One characteristic of this exemplified embodiment is that the depleting effect of the cathode layer 15 in the intermediate space 17 does not extend as far as the contacting layer 12 on the bottom side 10. On the contrary, the cathode layer 15 which acts as a depletion electrode forms in the intermediate space 17 only one depletion island which extends only partially into the depth.

Figure 7:
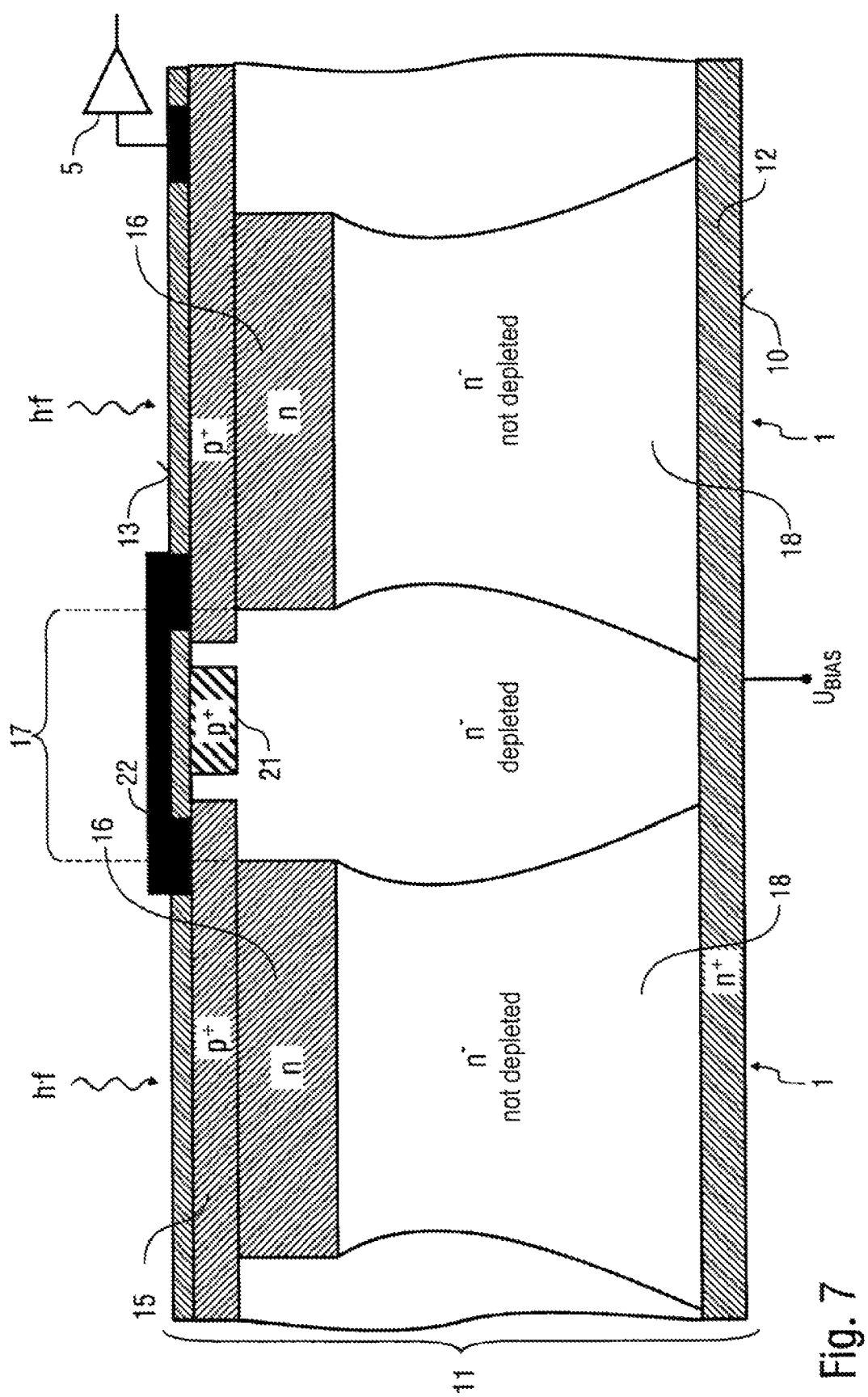
FIG. 7 shows a modification of the exemplified embodiment of FIG. 3, wherein the cathode layer is interrupted in the intermediate space between the adjacent avalanche photodiodes and depletion is effected by means of a separate depletion electrode.

The exemplified embodiment as shown in FIG. 7 again corresponds extensively with the above-described exemplified embodiment illustrated in FIG. 3, so that in order to avoid repetition reference is made to the above description, wherein the same reference numerals are used for corresponding details.

One characteristic in this case is that the cathode layer 15 is not laterally continuous but is interrupted in the intermediate space 17.

Instead of this, the intermediate space 17 has a separate depletion electrode 21 disposed therein which can be controlled independently of the avalanche photodiodes 1, which for simplification is not illustrated in this case.

Furthermore, the cathode layers 15 of the adjacent avalanche photodiodes are electrically connected to each other in this case by means of a line element 22.

Figure 8:
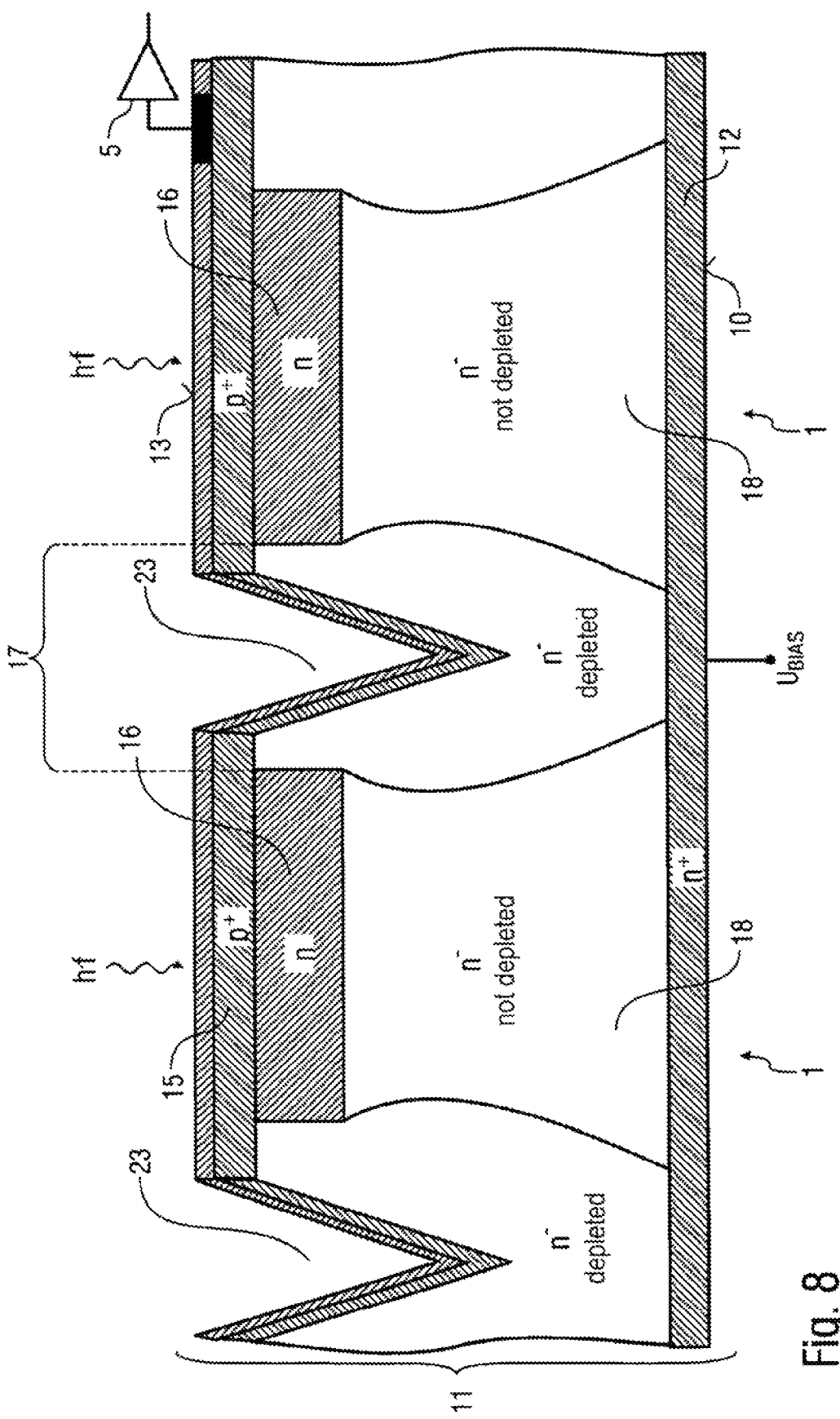
FIG. 8 shows a modification of the exemplified embodiment of FIG. 3, wherein an optical isolation is provided in the intermediate space between the adjacent avalanche photodiodes.

FIG. 8 also illustrates an exemplified embodiment which in turn corresponds extensively with the exemplified embodiment as shown in FIG. 3, so that in order to avoid repetition reference is made to the above description, wherein the same reference numerals are used for corresponding details.

One characteristic is that provided in the intermediate space 17 between the adjacent avalanche photodiodes is an optical isolation which isolates the adjacent avalanche photodiodes optically from one another, in order to prevent any optical crosstalk.

The optical isolation consists of isolation trenches 23 which are etched in the intermediate space 17 into the semiconductor substrate 11, wherein the isolation trenches absorb and/or reflect photons.

Figure 9:
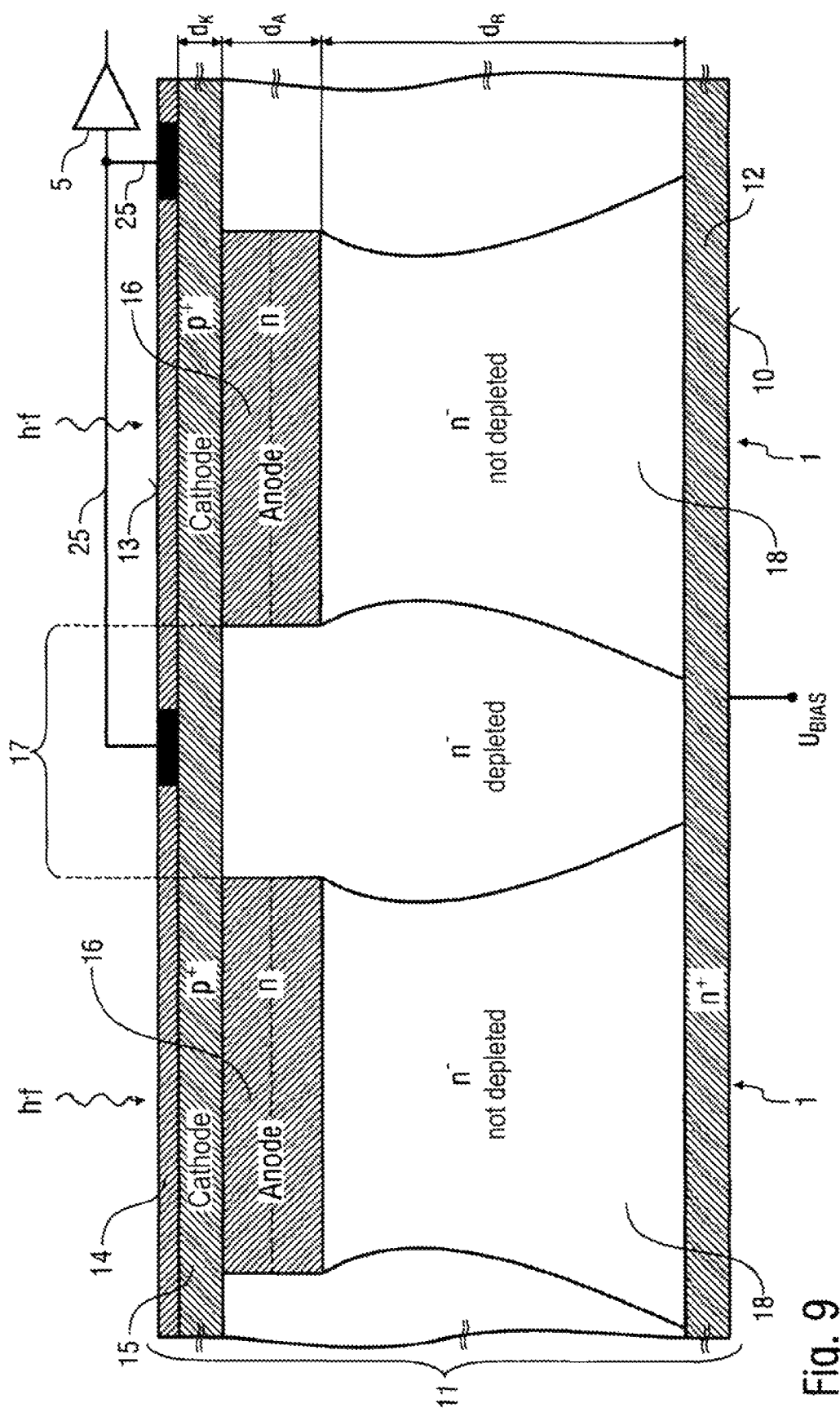
FIG. 9 shows a modification of the exemplified embodiment of FIG. 3, wherein several connection lines are provided.

Finally, the exemplified embodiment as shown in FIG. 9 also extensively corresponds with the above-described exemplified embodiment illustrated in FIG. 3, so that in order to avoid repetition reference is made to the above description, wherein the same reference numerals are used for corresponding details.

One characteristic of this exemplified embodiment is that the connection to the amplifier 5 is not established by means of a single connection line but rather by means of several connection lines 24, 25 which are connected electrically in parallel. This prevents any excessively high voltage drops from occurring along the cathode layer 15.

Figure 10:
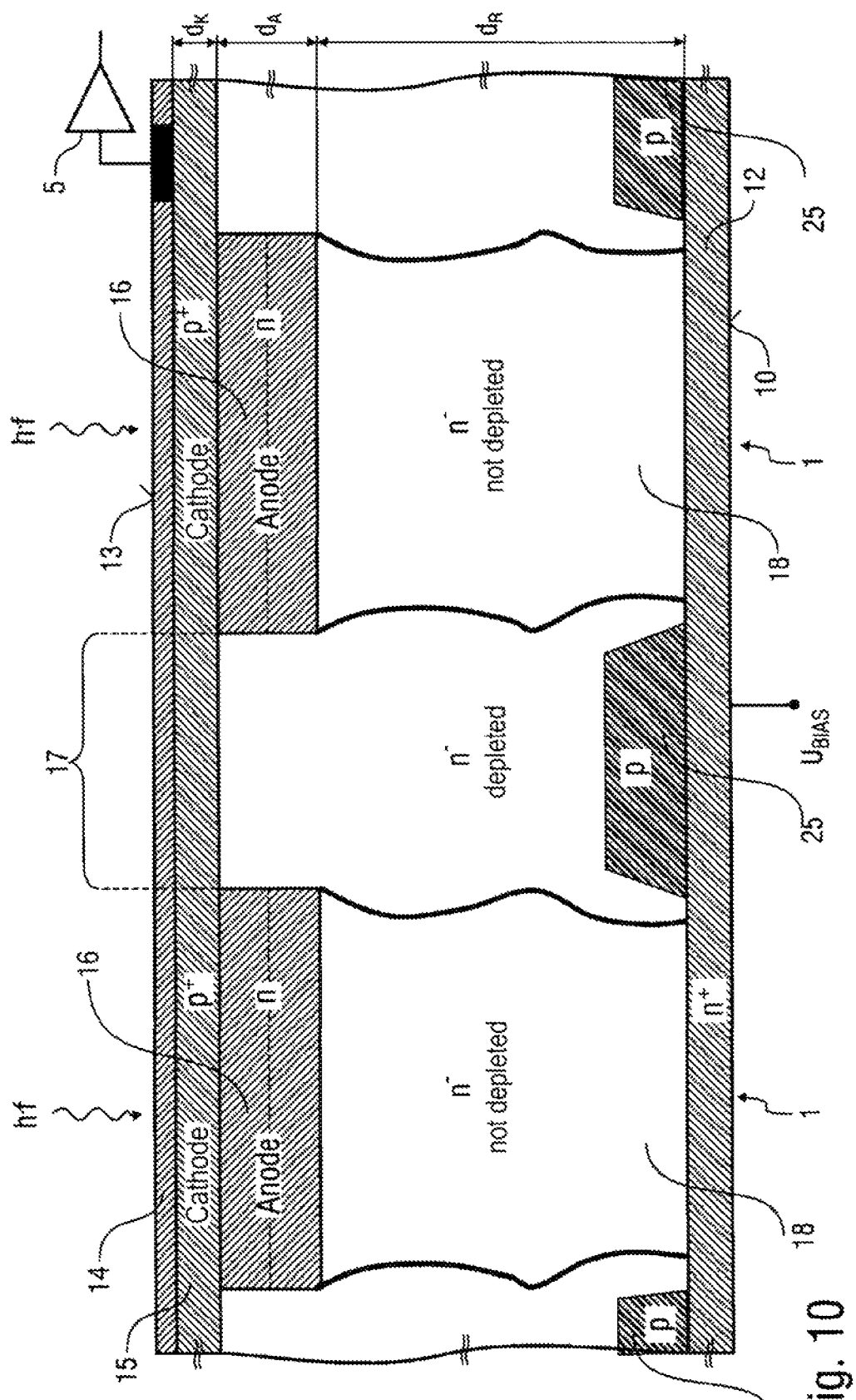
FIG. 10 shows a modification of the exemplified embodiment of FIG. 3, wherein a doped region is provided.
Figure 11:
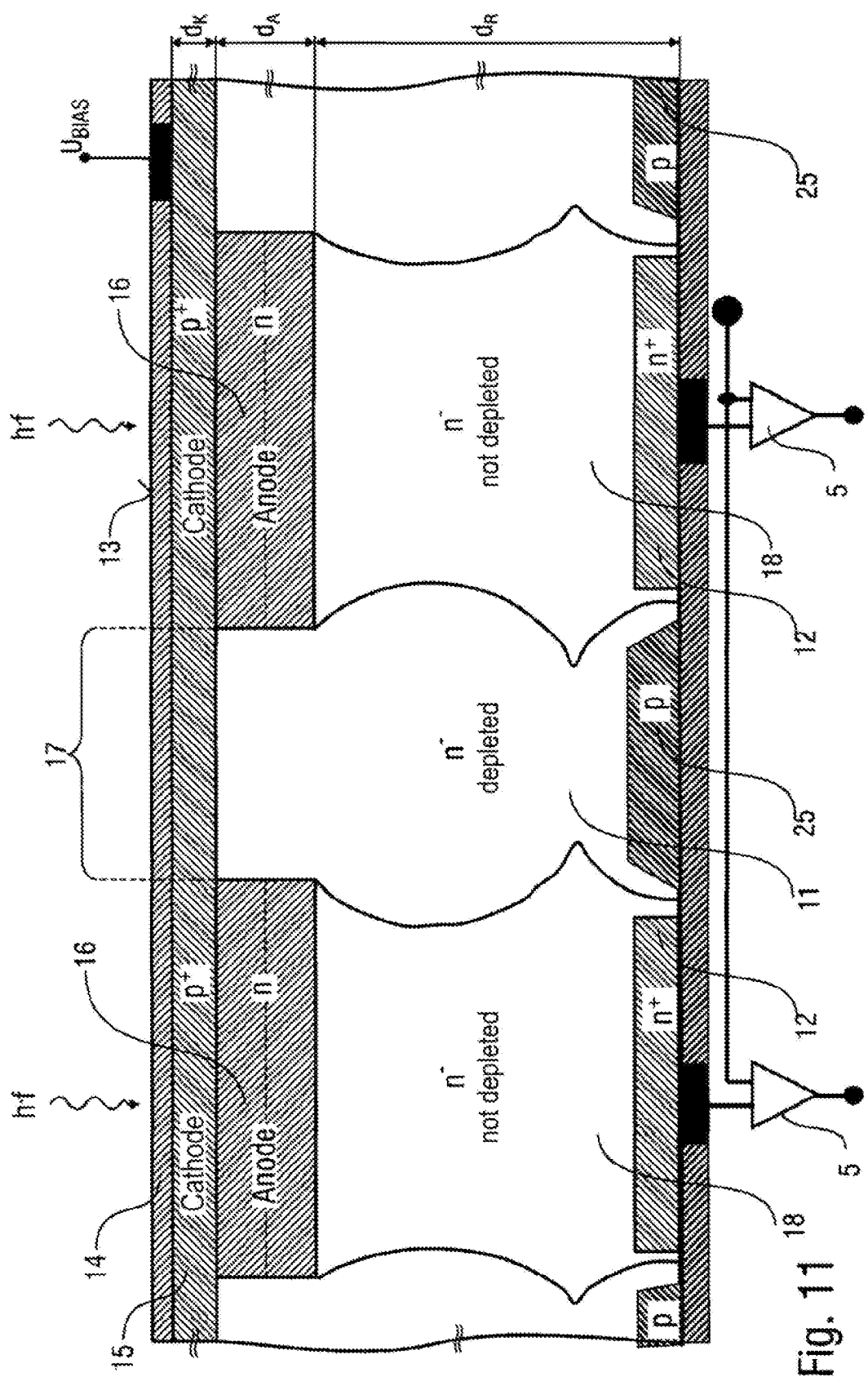
FIG. 11 shows a modification of the exemplified embodiment of FIG. 5, wherein in each case an amplifier is additionally provided for each diode.

FIGS. 10 and 11 illustrate further modifications of the above-described exemplified embodiment illustrated in FIG. 3. In order to avoid repetition, reference is made to the above description, wherein the same reference numerals are used for corresponding details.

The characteristic of the exemplified embodiment illustrated in FIG. 10 resides in the provision of a p-doped region 25 in the lower part of the intermediate space 17. The doped region 25 generates an intrinsic space charge zone, by means of which the semiconductor substrate 11 is additionally depleted laterally next to the quenching resistor 18. The space charge zone is overlaid with the upper space charge zone which is generated by the depletion electrode 15 laterally with respect to the anode layer 16.

However, the p-doped region 25 does not have to be limited to the lower part of the intermediate space 17. By means of a lateral extension of this region below the anode layer 16, the quenching resistance layer 18 can be further limited and therefore its resistance value can be increased.

In the case of the exemplified embodiment illustrated in FIG. 11, read-out amplifiers 5 are disposed on the rear side of the photodiode and render it possible to read out measurement signals in a locally resolved manner.

The hitherto described geometric arrangements facilitate the temporally resolved counting of individual photons but not the locally resolved detection (imaging) thereof. In order to achieve this aim, one of the read-out nodes must be segmented, whereby ideally each avalanche photodiode obtains its own read-out node. However, in the case of larger, finely segmented detectors the required connection lines can no longer be fed laterally for reasons of space. By means of three-dimensional integration techniques such as bump-bonding or SLID (Solid Liquid Interdiffusion, see A. Kumpp et al. "Vertical System Integration by using interchip vias and solid liquid interdiffusion bonding", "J. Jap. Appl. Phys.", vol. 43, no. 7A, 2004), system components which are produced in various technologies can be connected vertically via metal contacts. This type of system can consist e.g. of an avalanche-diode-sensor chip and a highly integrated read-out chip which contains several amplifiers. In this case, the read-out chip must be mounted on the rear side, in order not to conceal the optical entry window on the top side.

Figure 5:
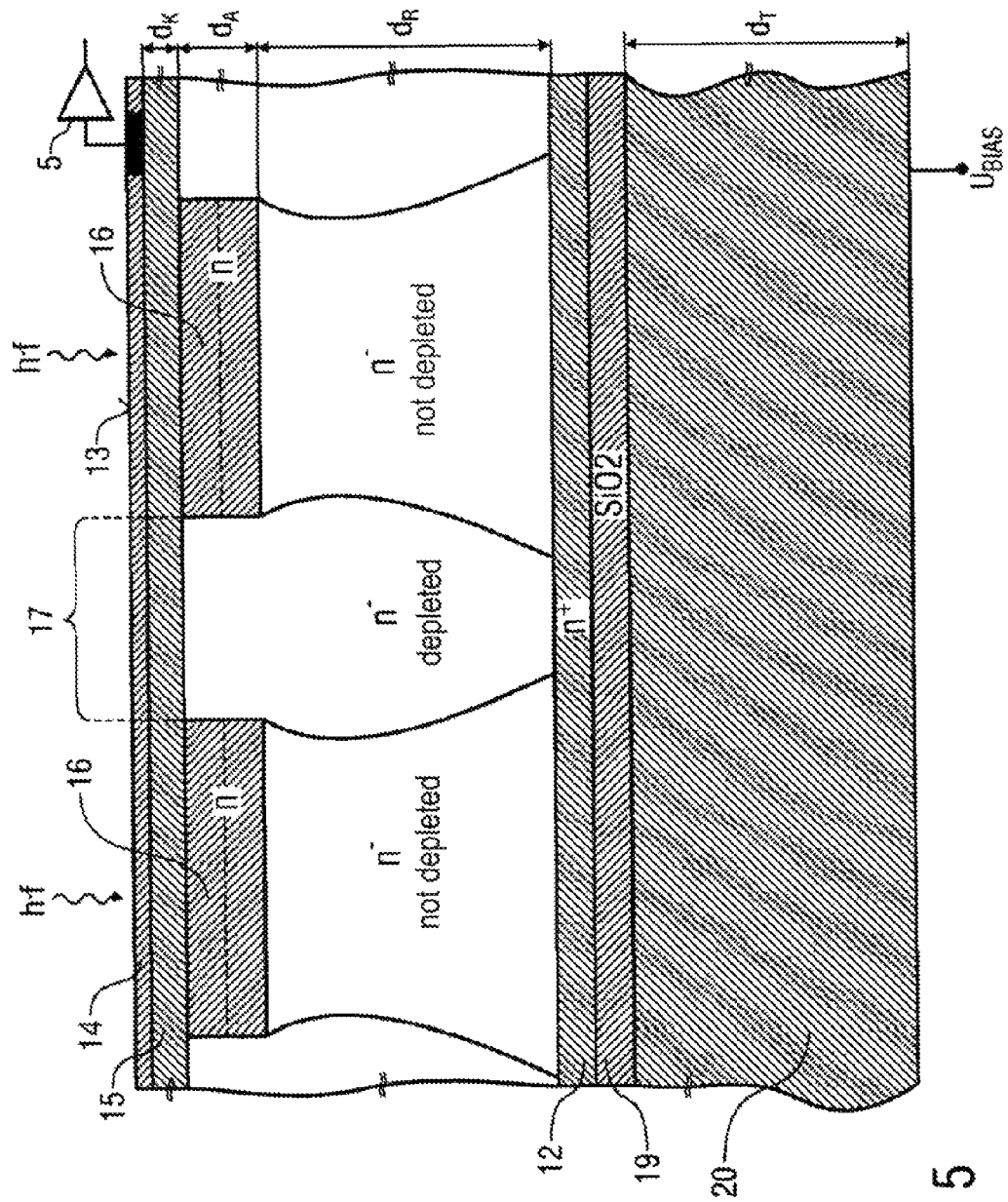
FIG. 5 shows a modification of the exemplified embodiment of FIG. 4 which is produced by wafer bonding.

The exemplified embodiment which is illustrated in FIG. 5 and in which the wafer bonding method is used can be changed as shown in FIG. 11 into a position-sensitive detector. For this purpose, the rear-side contacting layer 12 is introduced in a structured manner preferably prior to wafer bonding. In the case of the embodiment having an n+ doped contacting layer 12, an isolating p-layer 25 is required in the intermediate spaces (FIG. 11). After processing of the wafer with the sensor chips, the carrier wafer 20 is removed preferably by etching, wherein the isolation layer 19 can be used as an etch stop. Then, contact holes are etched into the isolation layer and metallized. The read-out chip is contacted with the aid of the techniques mentioned. FIG. 11 schematically illustrates the amplifiers 5 on the read-out chip.

The invention is not limited to the above-described preferred exemplified embodiments. On the contrary, a plurality of variations and modifications are possible which also make use of the inventive idea and therefore fall within the scope of protection.

LIST OF REFERENCE NUMERALS 1 avalanche photodiode
2 read-out node
3 reload node
4 bias voltage node
5 amplifier
6 operating point
7 operating point
8 operating point
9 operating point
10 bottom side
11 semiconductor substrate
12 contacting layer
13 top side
14 optical filter layer
15 cathode layer
16 anode layer
17 intermediate space
18 quenching resistance layer
19 isolation layer
20 carrier layer
21 depletion electrode
22 line element
23 isolation trenches
24 contact
25 doped region
AD avalanche diode
$C_C$ coupling capacitance
$C_D$ diode capacitance
$R_Q$ quenching resistor
$U_{BIAS}$ bias voltage

The invention claimed is:

1. An avalanche photodiode for detecting radiation, comprising:
   a) a semiconductor substrate having a top side and a bottom side opposite said top side, wherein the semiconductor substrate is doped according to a first doping type,
   b) an upper diode layer which is disposed in the semiconductor substrate on the top side, is doped according to a second doping type and is contactable, wherein the second doping type is opposed to the first doping type,
   c) a laterally restricted lower diode layer which is disposed in the semiconductor substrate between the upper diode layer and the bottom side of the semiconductor substrate and is doped according to the first doping type,
   d) an avalanche region which extends below the upper diode layer, and is adapted to undergo a radiation-generated avalanche breakdown when triggered by the radiation to be detected,
   e) a contacting layer which is disposed on the bottom side of the semiconductor substrate and is doped according to the first doping type,
   f) a laterally restricted quenching resistance layer which is disposed in the semiconductor substrate between the lower diode layer and the contacting layer and is doped according to the first doping type, wherein the quenching resistance layer is adapted to quench the radiation-generated avalanche breakdown in the avalanche region, and
   g) a depletion electrode which is disposed at least partially in a lateral manner with respect to the laterally restricted lower diode layer and is doped according to the second doping type,
   wherein (i) the upper diode layer protrudes with a side portion laterally beyond the laterally restricted lower diode layer and together with the protruding side portion forms the depletion electrode, (ii) the depletion electrode is adapted to deplete the semiconductor substrate laterally next to the laterally restricted lower diode layer, and (iii) the quenching resistance layer of the lower diode layer is shielded from the depletion electrode such that the quenching resistance layer is not depleted or is only partially depleted.

2. The avalanche photodiode as claimed in claim 1, wherein the depletion electrode is separated from the upper diode layer.

3. The avalanche photodiode as claimed in claim 1, further comprising an optical filter layer which is applied to the top side.

4. An avalanche photodiode for detecting radiation, comprising:
   a) a semiconductor substrate having a top side and a bottom side opposite said top side, wherein the semiconductor substrate is doped according to a first doping type,
   b) an upper diode layer which is disposed in the semiconductor substrate on the top side, is doped according to a second doping type and is contactable, wherein the second doping type is opposed to the first doping type,
   c) a laterally restricted lower diode layer which is disposed in the semiconductor substrate between the upper diode layer and the bottom side of the semiconductor substrate and is doped according to the first doping type,
   d) an avalanche region which extends below the upper diode layer, and is adapted to undergo a radiation-generated avalanche breakdown when triggered by the radiation to be detected,
   e) a contacting layer which is disposed on the bottom side of the semiconductor substrate and is doped according to the first doping type,
   f) a laterally restricted quenching resistance layer which is disposed in the semiconductor substrate between the lower diode layer and the contacting layer and is doped according to the first doping type, wherein the quenching resistance layer is adapted to quench the radiation-generated avalanche breakdown in the avalanche region, and
   g) a depletion electrode which is disposed at least partially in a lateral manner with respect to the laterally restricted lower diode layer and is doped according to the second doping type,
   wherein the depletion electrode is adapted to deplete the semiconductor substrate laterally next to the laterally restricted lower diode layer, and the quenching resistance layer of the lower diode layer is shielded from the depletion electrode such that the quenching resistance layer is not depleted or is only partially depleted, and
   wherein the upper diode layer and the contacting layer
   i) extend in a lateral direction without interruption over an entire width of the avalanche photodiode and
   ii) are laterally unstructured.

5. The avalanche photodiode as claimed in claim 3, wherein the optical filter layer extends without interruption over the avalanche region.

6. The avalanche photodiode as claimed in claim 1, wherein the quenching resistance layer has a resistance value of such a magnitude that in the event of an avalanche breakdown a current in the avalanche region temporarily dies off so as to terminate the avalanche breakdown.

7. The avalanche photodiode as claimed in claim 1, wherein the upper diode layer is a cathode layer, whereas the lower diode layer (16) is an anode layer.

8. The avalanche photodiode as claimed in claim 1, further comprising a radiation entry window which is disposed on the top side for absorbing the radiation to be detected.

9. The avalanche photodiode as claimed in claim 1, wherein the contacting layer is a highly doped wafer, to which the quenching resistance layer is applied.

10. The avalanche photodiode as claimed in claim 1, further comprising a carrier layer which is disposed on the bottom side of the contacting layer and mechanically supports the avalanche photodiode.

11. The avalanche photodiode as claimed in claim 10, wherein the carrier layer includes materials selected from the group consisting of silicon, silicon dioxide, glass, sapphire, a ceramic and a highly doped semiconductor material.

12. The avalanche photodiode as claimed in claim 10, further comprising an isolation layer which is disposed between the contacting layer and the carrier layer.

13. The avalanche photodiode as claimed in claim 12, wherein the isolation layer consists of silicon dioxide.

14. The avalanche photodiode as claimed in claim 1, wherein the semiconductor substrate comprises at least one doping profile of the first doping type.

15. An avalanche photodiode for detecting radiation, comprising:
   a) a semiconductor substrate having a top side and a bottom side opposite said top side, wherein the semiconductor substrate is doped according to a first doping type,
   b) an upper diode layer which is disposed in the semiconductor substrate on the top side, is doped according to a second doping type and is contactable, wherein the second doping type is opposed to the first doping type,
   c) a laterally restricted lower diode layer which is disposed in the semiconductor substrate between the upper diode layer and the bottom side of the semiconductor substrate and is doped according to the first doping type,
   d) an avalanche region which extends below the upper diode layer, and is adapted to undergo a radiation-generated avalanche breakdown when triggered by the radiation to be detected,
   e) a contacting layer which is disposed on the bottom side of the semiconductor substrate and is doped according to the first doping type,
   f) a laterally restricted quenching resistance layer which is disposed in the semiconductor substrate between the lower diode layer and the contacting layer and is doped according to the first doping type, wherein the quenching resistance layer is adapted to quench the radiation-generated avalanche breakdown in the avalanche region, and
   g) a depletion electrode which is disposed at least partially in a lateral manner with respect to the laterally restricted lower diode layer and is doped according to the second doping type,
   wherein: (i) the depletion electrode is adapted to deplete the semiconductor substrate laterally next to the laterally restricted lower diode layer, (ii) the quenching resistance layer of the lower diode layer is shielded from the depletion electrode such that the quenching resistance layer is not depleted or is only partially depleted, and (iii) provided in the semiconductor substrate laterally next to the quenching resistance layer is a doped region, in which the semiconductor substrate is doped according to the second doping type.

16. An avalanche radiation detector which comprises a plurality of avalanche photodiodes as claimed in claim 1.

17. The avalanche radiation detector as claimed in claim 16, wherein the individual avalanche photodiodes are connected in parallel with a common amplifier.

18. An avalanche radiation detector which comprises a plurality of avalanche photodiodes for detecting radiation, said avalanche photodiodes comprising:

a) a semiconductor substrate having a top side and a bottom side opposite said top side, wherein the semiconductor substrate is doped according to a first doping type, b) an upper diode layer which is disposed in the semiconductor substrate on the top side, is doped according to a second doping type and is contactable, wherein the second doping type is opposed to the first doping type, c) a laterally restricted lower diode layer which is disposed in the semiconductor substrate between the upper diode layer and the bottom side of the semiconductor substrate and is doped according to the first doping type, d) an avalanche region which extends below the upper diode layer, and is adapted to undergo a radiation-generated avalanche breakdown when triggered by the radiation to be detected, e) a contacting layer which is disposed on the bottom side of the semiconductor substrate and is doped according to the first doping type, f) a laterally restricted quenching resistance layer which is disposed in the semiconductor substrate between the lower diode layer and the contacting layer and is doped according to the first doping type, wherein the quenching resistance layer is adapted to quench the radiation-generated avalanche breakdown in the avalanche region, and g) a depletion electrode which is disposed at least partially in a lateral manner with respect to the laterally restricted lower diode layer and is doped according to the second doping type, wherein: (i) the depletion electrode is adapted to deplete the semiconductor substrate laterally next to the laterally restricted lower diode layer, (ii) the quenching resistance layer of the lower diode layer is shielded from the depletion electrode such that the quenching resistance layer is not depleted or is only partially depleted, (iii) individual avalanche photodiodes are connected in parallel with a common amplifier, (iv) the upper diode layer of the individual avalanche photodiodes extends in a lateral direction over several adjacent avalanche photodiodes, (v) the lower diode layer of the individual avalanche photodiodes is interrupted in each case between the adjacent avalanche photodiodes and comprises an intermediate space, and (vi) the upper diode layer depletes the semiconductor substrate in the intermediate space between the adjacent avalanche photodiodes and thereby electrically isolates the adjacent avalanche photodiodes from each other.

19. The avalanche radiation detector as claimed in claim 18, wherein the individual avalanche photodiodes are connected to the amplifier via a common connection line, wherein the connection line contacts the common upper diode layer.

20. The avalanche radiation detector as claimed in claim 18, wherein the individual avalanche photodiodes are connected to the amplifier via several parallel connection lines, wherein the individual connection lines each contact the upper diode layer in an area surrounding the respective avalanche photodiode.

21. The avalanche radiation detector as claimed in claim 20, wherein the individual connection lines contact the upper diode layer in each case in the intermediate space between the adjacent avalanche photodiodes.

22. An avalanche radiation detector which comprises a plurality of avalanche photodiodes for detecting radiation, said avalanche photodiodes comprising:

a) a semiconductor substrate having a top side and a bottom side opposite said top side, wherein the semiconductor substrate is doped according to a first doping type, b) an upper diode layer which is disposed in the semiconductor substrate on the top side, is doped according to a second doping type and is contactable, wherein the second doping type is opposed to the first doping type, c) a laterally restricted lower diode layer which is disposed in the semiconductor substrate between the upper diode layer and the bottom side of the semiconductor substrate and is doped according to the first doping type, d) an avalanche region which extends below the upper diode layer, and is adapted to undergo a radiation-generated avalanche breakdown when triggered by the radiation to be detected, e) a contacting layer which is disposed on the bottom side of the semiconductor substrate and is doped according to the first doping type, f) a laterally restricted quenching resistance layer which is disposed in the semiconductor substrate between the lower diode layer and the contacting layer and is doped according to the first doping type, wherein the quenching resistance layer is adapted to quench the radiation-generated avalanche breakdown in the avalanche region, and g) a depletion electrode which is disposed at least partially in a lateral manner with respect to the laterally restricted lower diode layer and is doped according to the second doping type, wherein: (i) the depletion electrode is adapted to deplete the semiconductor substrate laterally next to the laterally restricted lower diode layer, (ii) the quenching resistance layer of the lower diode layer is shielded from the depletion electrode such that the quenching resistance layer is not depleted or is only partially depleted, (iii) the depletion electrodes of individual avalanche photodiodes are separated in each case from the upper diode layer, (iv) the depletion electrodes are disposed in each case in the intermediate spaces between the adjacent avalanche photodiodes, (v) the depletion electrodes are jointly connected to a voltage source, and (vi) the upper diode layers of the adjacent avalanche photodiodes are connected to each other in each case by a line which bridges the intermediate space between the adjacent avalanche photodiodes.

23. The avalanche radiation detector as claimed in claim 17, further comprising an optical isolation between the adjacent avalanche photodiodes, in order to prevent any optical crosstalk between the adjacent avalanche photodiodes.

24. The avalanche radiation detector as claimed in claim 23, wherein the optical isolation consists of isolation trenches which are etched between the adjacent avalanche photodiodes and absorb or reflect photons generated in the avalanche photodiodes.

25. The avalanche radiation detector as claimed in claim 24, wherein the isolation trenches comprise trench walls which are doped according to the second doping type and are at a potential of the upper diode layer.

26. The avalanche radiation detector as claimed in claim 22, wherein the avalanche photodiodes are connected individually to a respective amplifier.

27. The avalanche photodiode as claimed in claim 1, wherein the upper diode layer is an anode layer, whereas the lower diode layer is a cathode layer.

* * * * *

UNITED STATES PATENT AND TRADEMARK OFFICE
CERTIFICATE OF CORRECTION

PATENT NO. : 8,258,594 B2
APPLICATION NO. : 12/672102
DATED : September 4, 2012
INVENTOR(S) : Rainer Richter et al.

It is certified that error appears in the above-identified patent and that said Letters Patent is hereby corrected as shown below:

On the title page at item (73), please add the following as a second Assignee:

Max-Planck-Gesellschaft zur Foerderung der Wissenschaften e.V., Munich (DE)

Signed and Sealed this
Twenty-seventh Day of August, 2013

Teresa Stanek Rea
*Acting Director of the United States Patent and Trademark Office*